(12) United States Patent
Tsai et al.

(10) Patent No.: US 9,034,756 B2
(45) Date of Patent: May 19, 2015

(54) INTEGRATED CIRCUIT INTERCONNECTS AND METHODS OF MAKING SAME

(75) Inventors: Cheng-Hsiung Tsai, Miaoli County (TW); Chung-Ju Lee, Hsin-Chu (TW); Tsung-Jung Tsai, Taipei (TW); Hsiang-Huan Lee, Jhudong Township (TW); Ming Han Lee, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/559,107

(22) Filed: Jul. 26, 2012

(65) Prior Publication Data

US 2014/0027908 A1    Jan. 30, 2014

(51) Int. Cl.
| | |
|---|---|
| *H01L 21/44* | (2006.01) |
| *H01L 21/768* | (2006.01) |
| *H01L 23/522* | (2006.01) |
| *H01L 23/532* | (2006.01) |

(52) U.S. Cl.
CPC ...... *H01L 21/76802* (2013.01); *H01L 21/7682* (2013.01); *H01L 21/76831* (2013.01); *H01L 21/76834* (2013.01); *H01L 21/76885* (2013.01); *H01L 23/5222* (2013.01); *H01L 23/53233* (2013.01); *H01L 23/53238* (2013.01); *H01L 23/53295* (2013.01); *H01L 2924/00* (2013.01); *H01L 2924/0002* (2013.01)

(58) Field of Classification Search
CPC .................. H01L 21/7682; H01L 23/53295; H01L 23/5222
USPC ........... 257/751, E23.012, E21.158, E21.581, 257/E21.584, E21.587; 438/597, 653
See application file for complete search history.

(56) References Cited

U.S. PATENT DOCUMENTS

| | | | | |
|---|---|---|---|---|
| 2005/0221554 A1* | 10/2005 | Huang | ......................... | 438/233 |
| 2005/0263896 A1* | 12/2005 | Lur et al. | ...................... | 257/758 |
| 2008/0026554 A1* | 1/2008 | Yang | ............................. | 438/597 |
| 2008/0075836 A1* | 3/2008 | Chen et al. | ...................... | 427/58 |
| 2011/0171826 A1* | 7/2011 | Huang | ......................... | 438/643 |
| 2012/0244698 A1* | 9/2012 | Ryan | ............................. | 438/653 |
| 2012/0269987 A1* | 10/2012 | Dordi et al. | .................. | 427/539 |
| 2012/0319279 A1* | 12/2012 | Isobayashi | ................... | 257/751 |
| 2013/0071955 A1* | 3/2013 | Kintaka et al. | .................... | 438/9 |

* cited by examiner

*Primary Examiner* — Colleen A Matthews
*Assistant Examiner* — Colleen E Snow
(74) *Attorney, Agent, or Firm* — Slater & Matsil, L.L.P.

(57) ABSTRACT

A copper alloy layer is blanket deposited over a low k dielectric layer and in via openings within the low k dielectric layer. The blanket deposited layer is then anisotropically etch to form horizontal interconnects. The interconnects are annealed to form a metal oxide barrier lining. A second low k dielectric layer is then depositing over the horizontal interconnects. Air gaps can be formed between adjacent interconnects to lower parasitic capacitance therebetween.

20 Claims, 4 Drawing Sheets

INTEGRATED CIRCUIT INTERCONNECTS AND METHODS OF MAKING SAME

BACKGROUND

Since the mid-1990's so-called damascene processes have been the dominant technology for forming conductive interconnect in integrated circuits. Those skilled in the art recognize that damascene processing involves forming opening (via and trenches) in a dielectric layer and then filling the openings with a conductive, typically copper. The copper is typically deposited by initially depositing a thin seed layer within the openings and then filling the opening by electroplating copper.

One disadvantage of the prior art is that forming openings in the dielectric layer requires etching the dielectric layer. This etch process may damage the dielectric layer, particularly as the industry trends progress toward lower dielectric constant (low k) dielectric layers, which are more vulnerable to damage form the etching process. Increased leakage current, reduced dielectric constant, and reduced performance and reliability may result from the etch-induced damage to the dielectric layer.

Another disadvantage of the traditional damascene approach is that the etching processes can also damage a barrier layer that is frequently used to line the opening prior to deposition of the copper. Furthermore, subsequent thermal processing may sometimes cause the copper features within the openings to deform, such as to form a hump in the center, which can negatively impact the device performance and reliability.

What is needed then is a interconnect structure and method of forming same that overcomes or reduces the disadvantages of the prior art.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
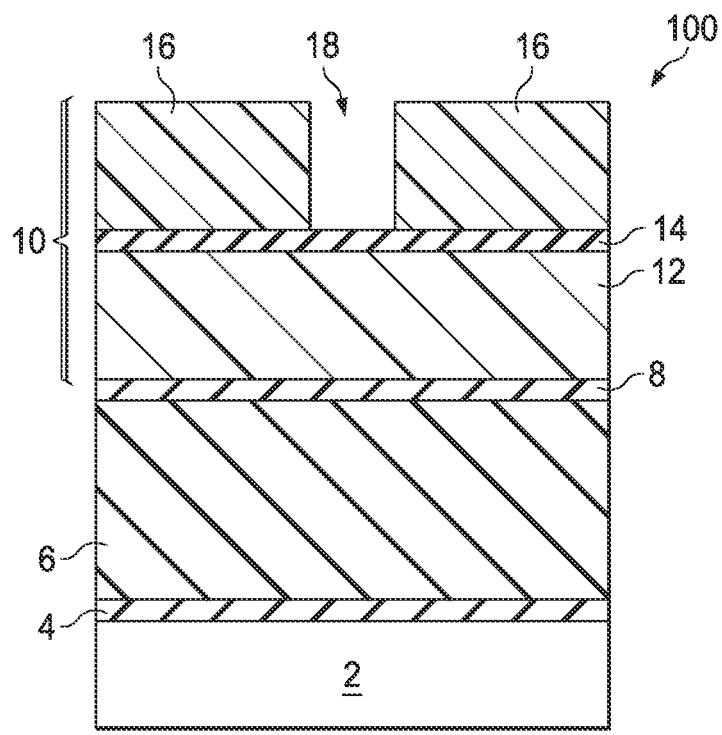
FIGS. 1a through 1g are cross-sectional views of an illustrative method of forming an integrated circuit interconnect structure.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely an interconnect structure for an integrated circuit. Other embodiments may also be applied, however, to other semiconductor devices and feature. For instance, the present teachings could be applied to structures other than an integrated circuit, such as an interposer device, a printed circuit board, a package substrate, and the like.

With reference now to FIG. 1, there is shown an illustrative integrated circuit (structure) 100 shown in highly simplified cross-sectional views. Various features not necessary for understanding of the invention have been omitted for sake of clarity and brevity. Integrated circuit 100 includes a substrate 2 upon which has been formed an etch stop layer 4. Substrate 2 refers generally to any structures or materials underlying etch stop layer 4. In some applications, substrate 2 includes a semiconductor wafer such as a bulk silicon wafer or a silicon (or other semiconductor material) layer formed atop a bulk wafer and separated therefrom by, e.g., a buried oxide layer in a so-called silicon on insulator (SOI) arrangement. One or more active or passive devices, such as transistors or capacitors, could be formed in substrate 2. In another application, substrate 2 could be an underlying metal (or other conductor) layer in a multi-metal interconnect scheme. For instance, substrate 2 could be an underlying metal layer (or several stacked metal layers) manufactured according to the steps illustrated in FIGS. 1a through 1g.

A dielectric layer, preferably a low k dielectric layer 6 is formed on the etch stop layer. Low k generally refers to a dielectric layer having a dielectric constant of less than about 3.9. Materials such as porous silicon oxide, doped silicon oxide, silicon carbide, silicon oxynitride, and the like could be employed for dielectric layer 6, although these are examples only and are not intended to be exhaustive or limiting.

Hard mask 8 is formed atop dielectric layer 6. In a case where dielectric layer 6 is an oxide, hard mask 8 could be, for example, silicon nitride or another material that has a high degree of resistance to etchants typically employed to etch oxides. Other materials, such as SiCN, SiOC, and the like could also be employed for hard mask 8.

Mask 10 is formed atop hard mask 8. In the illustrated embodiment, mask 10 is a tri-layer mask comprising three separate layers. While a conventional mask layer, such as a single polymer photoresist layer, could be employed, a tri-layer mask 10 allows for the formation of finer features having smaller dimensions and pitch. In the illustrated embodiment, bottom layer 12 of tri-layer mask 10 is a carbon organic layer, similar to a conventional photoresist layer. Middle layer 14 is a silicon containing carbon film, employed to help pattern bottom layer 12. Top layer 16 is a photoresist material, such as for instance, a photoresist material designed for exposure to 193 nm wavelengths, and preferably designed for immersion photolithography, for instance.

Figure 1B:
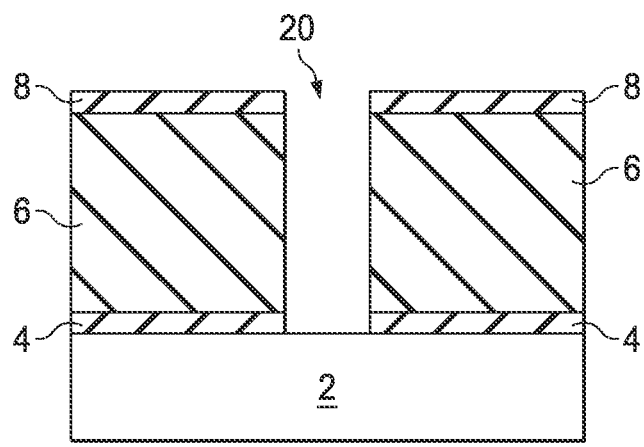

As shown in FIG. 1a, an opening is formed in mask 10, using known lithography techniques, such as for instance, immersion photolithography. This opening will be transferred to all layers of mask layer 10, through hard mask stop layer 8 and then to dielectric layer 6 and etch stop layer 4, resulting in an opening 20, sometimes referred to herein as a via opening, being formed in dielectric layer 6 and etch stop layer 4, as shown in FIG. 1b. Note that opening 20 exposes an underlying portion of substrate 2 which, as described above, could be an underlying conductive interconnect, a transistor contact, or the like. Mask 10 is removed using known ashing and/or etching techniques, the details of which are omitted herein.

Figure 1C:
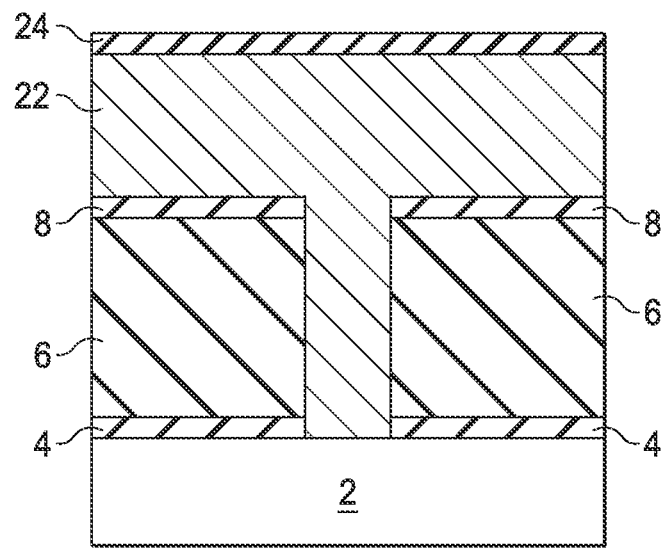

Turning now to FIG. 1c, a metal interconnect material 22 is deposited over structure 100. In illustrated embodiments, metal interconnect material is a copper alloy. Examples of a suitable copper alloy include CuMn, CuCr, CuV, CuNb, and CuTi. The copper alloy may be in the range of from about 90% copper to about 99.8% copper. Other suitable alloys and percentages will be apparent to those skilled in the art upon undertaking routine experimentation once informed by the present disclosure. By using a copper alloy material, it is possible to manufacture copper interconnects without the need to form barrier liners, such as Ta/, TaN, and the like, that are commonly employed in conventional damascene processes. That being said, it is within the contemplated scope of the present invention that a barrier liner could be employed in some applications.

In one embodiment, metal interconnect material 22 is formed by a plasma vapor deposition (PVD) that completely fills opening 20 and forms a blanket coating over a top surface of dielectric layer 6, or more accurately over the top surface of hard mask 8 overlying dielectric layer 6. In some embodiments, hard mask 8 may be omitted, in which case metal interconnect material 22 would be formed on dielectric layer 6. Metal interconnect material 22 may be formed to a thickness above dielectric layer 6 of from about 500 A to about 2 um, depending upon the desired application and the technology node employed.

In another embodiment, metal interconnect material 22 is formed by first depositing a seed layer by, e.g., PVD deposition techniques. The seed layer could be formed to a thickness of perhaps about 20 Å to about 100 Å, although other thicknesses could be employed depending upon the application and the desired process. Then a copper alloy material is formed on the seed layer using, e.g., an electro-plating or electro-less plating technique.

Etch stop layer 24 is formed on metal interconnect material 22, as also shown in FIG. 1c. In one embodiment, etch stop layer 24 is formed of silicon nitride, silicon carbon nitride, or another material that provides sufficient etch selectivity relative to the metal material.

Figure 1D:
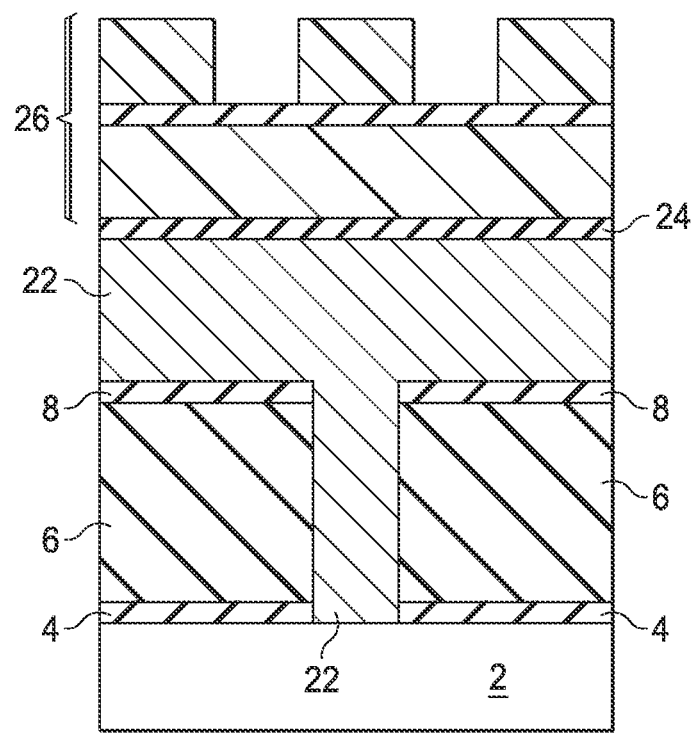
Figure 1E:
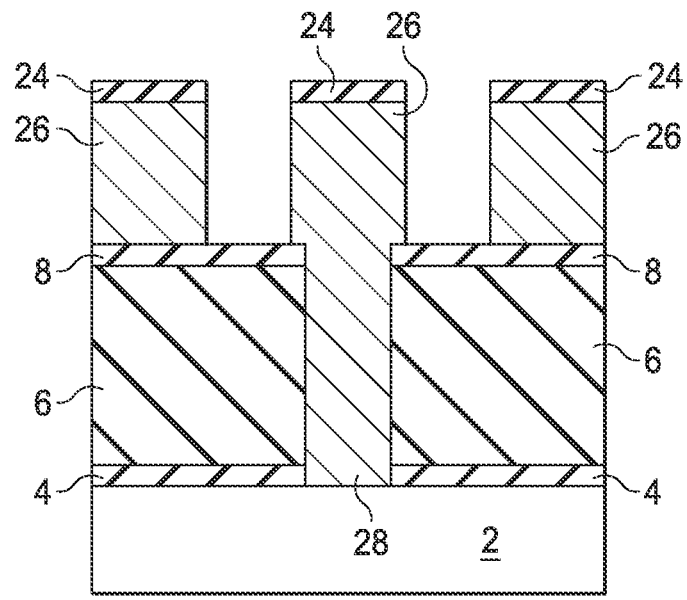

Turning now to FIG. 1d, a second mask 26 is formed. In the illustrated example, mask 26 is a tri-layer mask similar to mask 10 illustrated in FIG. 1a. As with the previously described steps, it is not necessary to use a tri-layer mask, unless the particular application and feature size calls for such an approach. Regardless of the mask type employed, a pattern is formed in mask layer 26 as shown in FIG. 1d. Next, as shown in FIG. 1e, the pattern is transferred to metal interconnect material 22 using known lithography techniques. Metal interconnect material is preferably etched anisotropically etched to form nearly vertical sidewalls. In some embodiments, a chlorine plasma etch is employed to pattern metal interconnect material 22. Other plasma etches, including reactive ion etching (RIE), could also be employed.

The result of the etching step is that metal interconnect material 22 is patterned into various wires or interconnects 26. These interconnects run across the major surface of device 100 and are sometimes referred to herein as horizontal interconnects to distinguish from the vertical interconnects (vias) 28 formed in the openings 20. Because metal is formed in the via openings 20 simultaneously with forming the blanket coating, using a single process step, the horizontal and vertical interconnects form a single continuous feature. One skilled in the art will recognize that horizontal interconnect features 26 and vertical interconnect features 28 are functionally equivalent to metal-filled trenches and vias formed using conventional damascene processes. Damage to the surrounding dielectric layers, however, that result from damascene processes is avoided, as is the potential for damage to barrier liners.

Figure 1F:
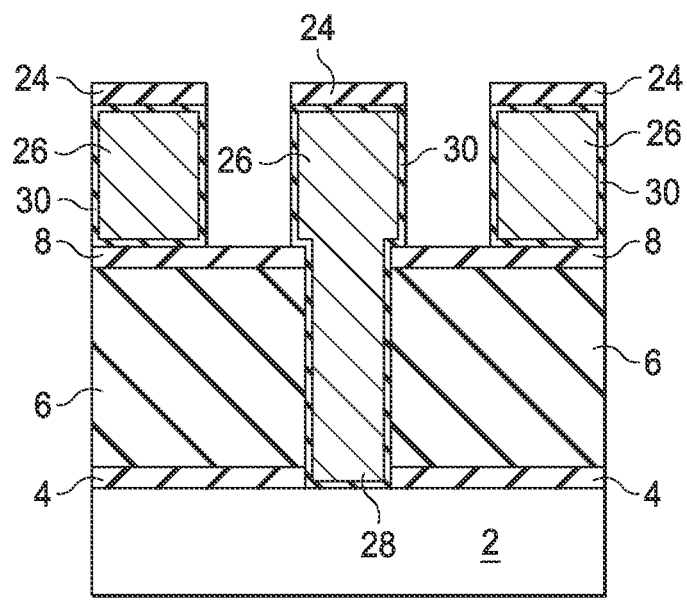

FIG. 1f illustrates the results of an anneal step. Structure 100 is subjected to an anneal whereby a self-aligned metal oxide barrier 30 is formed. In one embodiment, structure 100 is placed in an inert environment, such as 95% $H_2$, 5% $N_2$ and annealed at a temperature of from about 200 C to about 400 C for a time period of from about 30 minutes to about 120 minutes, for example. As a result of the anneal, a relatively thin metal oxide barrier is formed around the copper alloy features (e.g., around horizontal interconnects 26 and vertical interconnects 28). It is believed that moisture within the anneal chamber and within materials adjacent the copper alloy features contribute to the process of forming the metal oxide barrier. In illustrative embodiments, metal oxide barrier 30 is formed to a thickness of about 20 Å. Other thicknesses could readily be obtained depending upon the desired application and process parameters. This metal oxide barrier prevents diffusion of copper into the surrounding dielectric materials.

Figure 1G:
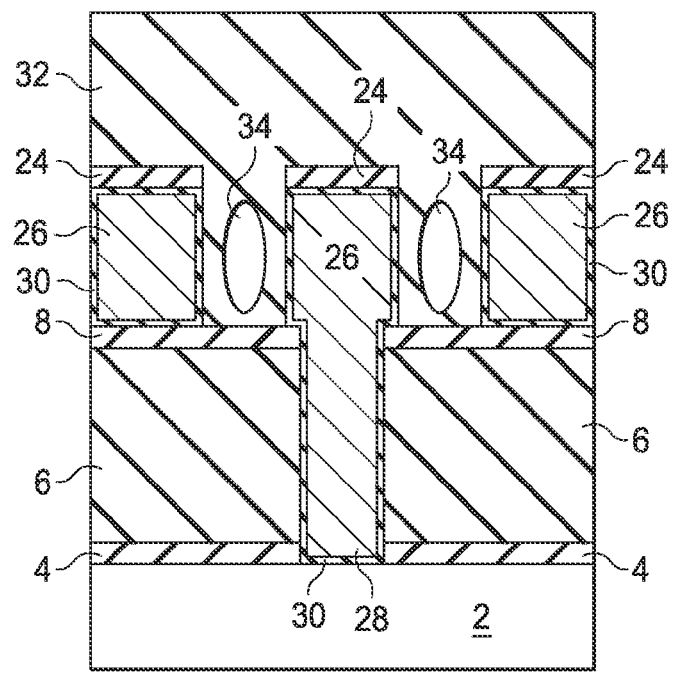

FIG. 1g illustrates the results of a deposition step in which a second dielectric layer 32 is deposited over structure 100. Second dielectric layer 32 is preferably a low k dielectric layer and may be of the same material as dielectric layer 6 or some other material. In one embodiment, dielectric layer 32 is formed of SiOC, as an example. Other materials could also be used. In some embodiments, dielectric layer 32 is formed by CVD deposition. In other embodiments, dielectric layer 32 is formed by a spin on coating process. In either event, it is sufficient that dielectric layer 32 be able to satisfactorily fill gaps between adjacent horizontal interconnect features 26 and cover (and hence electrically insulate) the features. Although shown as a single layer, dielectric layer 32 could be a compound layer comprised of two or more different materials and/or sub-layers.

An advantageous, but not necessary, feature of the illustrated embodiment is the formation of air gaps 34 in the spaces between adjacent horizontal interconnect features. In some embodiments, the spacing between adjacent horizontal interconnect features may be as little as 14 nm or 10 nm. In future applications, it is contemplated the spacing could be even less. Because horizontal interconnect features may be intended to current electrical signals, capacitance between adjacent interconnect features could adversely impact performance. The presence of air gaps 34 between adjacent interconnect features lowers the dielectric constant between the features and hence reduces parasitic capacitance therebetween. One skilled in the art will recognize that deposition parameters can be adjusted to obtain such air gaps, upon routine experimentation once informed by the present disclosure.

Further processing steps could include planarizing a top surface of dielectric layer 32, and/or the formation of additional vertical and horizontal interconnect features. As but one example, additional openings could be formed in dielectric layer 32 and additional vertical and horizontal interconnects formed in and on, respectively, dielectric layer 32, by repeating the above described process steps in which case dielectric layer 32 would be substituted for dielectric layer 6 in the above description. Alternatively, dielectric layer could be thinned down (e.g., via chemical mechanical polish, CMP, by etch back, or the like) and a separate dielectric layer, which would be substituted for dielectric layer 6, could be formed and the above steps repeated thereon. In some embodiments, dielectric layer 32 could be a topmost dielectric layer, which could then be treated for bonding to a corresponding layer of a second integrated circuit device in a so-called direct bonding process. In yet another embodiment, contact pads or the like could be formed atop dielectric layer 32 or in the form of one or more horizontal interconnect features 26, for connecting integrated circuit structure 100 to another device, such as another integrated circuit, an interposer, a circuit board, or the like.

Figure 2:
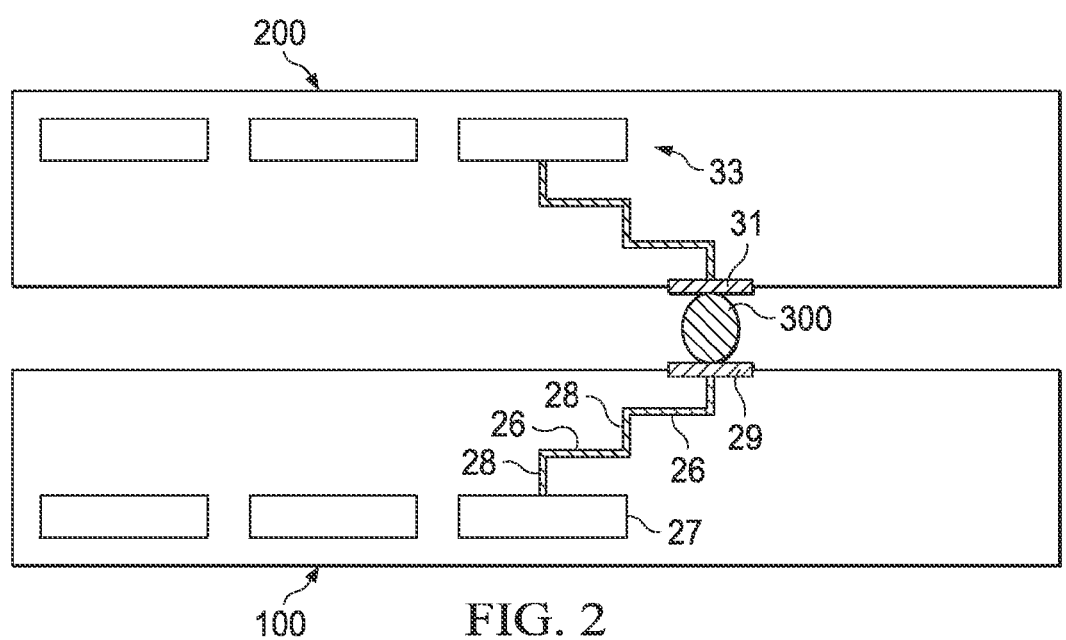
FIG. 2 is a cross-sectional view of a multi-chip structure manufactured according to an illustrative embodiment.

FIG. 2 illustrates an application wherein a first structure 100, such as an integrated circuit, is electrically interconnected to a second structure 200, such as a second integrated circuit, an interposer, an printed circuit board, a package substrate, or the like, by way of a connector element 300, such as a solder bump or solder ball, a copper pillar, a copper bump, or the like. More specifically, a first circuit element 27, such as a transistor, a resistor, a capacitor, or the like, of structure 100 is electrically connected to a first contact pad 29 of structure 100, which in turn electrically connects to a second contact pad 31 of second structure 200 via connector 300. Second contact pad 31 is electrically connected to a second circuit 33 of second structure 200. In this way, first circuit element 27 is electrically connected to second circuit 33 by way of horizontal and vertical interconnects 26 and 28, respectively, which are manufactured according to the above-described embodiments.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

As but one example, in some embodiments, an integrated circuit interconnect structure is formed by forming a dielectric layer on a substrate and patterning the dielectric layer to from an opening in the dielectric layer. The opening is filled with a metal and at the same time the dielectric layer is covered with the metal. The metal is patterned to form interconnect features. The interconnect features are annealed, thus forming a metal oxide barrier. A second dielectric material is then deposited around the interconnect features.

As another example, an integrated circuit interconnect structure is formed by forming a via opening in a dielectric layer, and filling the via opening with a copper alloy while at the same time depositing a blanket coating of the copper alloy over a top surface of the dielectric layer. The method includes patterning the blanket coating of the copper alloy to form interconnect features, wherein at least two of the interconnect features are separated by a gap. The interconnect features are covered and the gap is filled with a second dielectric layer.

In yet another embodiment, an integrated circuit interconnect structure comprises a first dielectric layer and a continuous copper alloy feature extending vertically into the first dielectric layer and extending vertically over the first dielectric layer. The structure further includes a second copper alloy feature extending horizontally over the first dielectric layer, and a copper oxide barrier layer substantially surrounding the continuous copper alloy feature. The structure also includes a second dielectric layer as between the continuous copper alloy feature and the second copper alloy feature, and an air gap within the second dielectric layer, the air gap being between the continuous copper alloy feature and the second copper alloy feature.

What is claimed is:

1. A method for forming an integrated circuit interconnect structure comprising:
   forming a first dielectric layer on a substrate;
   patterning the first dielectric layer to form an opening in the first dielectric layer;
   filling the opening and covering the first dielectric layer with a metal;
   patterning the metal to form interconnect features having first portions surrounded by the first dielectric layer and second portions extending across a major surface of the first dielectric layer;
   annealing the interconnect features, the annealing forming a barrier on the surface of the interconnect features, wherein at least a portion of the barrier is disposed between the first dielectric layer and a surface of the interconnect feature disposed within the first dielectric layer; and
   depositing a second dielectric material on the first dielectric layer and around the second portions of the interconnect features.

2. The method of claim 1 wherein forming a first dielectric layer on a substrate comprises:
   depositing a low k dielectric layer selected from the group consisting essentially of silicon oxide, silicon oxynitride, silicon carbide, and combinations thereof, using a process selected from the group consisting essentially of chemical vapor deposition, plasma enhanced chemical vapor deposition, spin on coating, and combinations thereof.

3. The method of claim 1 wherein patterning the first dielectric layer to form an opening comprises:
   forming a hard mask over the first dielectric layer;
   forming a tri-layer mask over the hard mask;
   forming an opening in the tri-layer mask;
   forming an opening in the hard mask using the tri-layer mask as a pattern; and
   an isotropically etching the opening in the first dielectric layer.

4. The method of claim 1 wherein filling the opening and covering the first dielectric layer with a metal comprises:
   lining the opening in the first dielectric layer with a copper alloy seed layer using a physical vapor deposition process; and
   electroplating a copper alloy in the opening and over the first dielectric layer.

5. The method of claim 4 wherein the copper alloy is selected from the group consisting essentially of CuMn, CuCr, CuV, CuNb, CuTi, and combinations thereof.

6. The method of claim 1 wherein filling the opening and covering the first dielectric with a metal comprises:
   electroplating a copper alloy in the opening and over the first dielectric layer.

7. The method of claim 6 wherein the copper alloy is selected from the group consisting essentially of CuMn, CuCr, CuV, CuNb, CuTi, and combinations thereof.

8. The method of claim 1 further comprising:
   forming an etch stop layer over the metal prior to patterning the metal.

9. The method of claim 1 wherein depositing a second dielectric material around the second portions of the interconnect features comprises:
   depositing a low k dielectric material covering the interconnect features using a process selected from the group consisting essentially of chemical vapor deposition and spin on coating.

10. The method of claim 1 wherein annealing the interconnect features causes formation of a metal oxide barrier lining the interconnect features.

11. A method of forming an integrated circuit interconnect structure comprising:

forming a via opening in a first dielectric layer, wherein the first dielectric layer is disposed over a substrate;

filling the via opening with a copper alloy;

depositing a blanket coating of the copper alloy over a top surface of the first dielectric layer simultaneously with filling the via opening;

patterning the blanket coating of the copper alloy to form interconnect features extending both vertically into the via opening and horizontally across the top surface of the first dielectric layer, at least two interconnect features being separated by a gap;

after forming the interconnect features, forming a barrier layer on the surface of the interconnect features, wherein the barrier layer is disposed in the via opening between the substrate and a portion of the interconnect features; and covering the interconnect features and the first dielectric layer and filling the gap with a second dielectric layer.

12. The method of claim 11 wherein the step of covering the interconnect features and filling the gap with a second dielectric layer includes:

forming an air gap within a portion of the dielectric layer filling the gap.

13. The method of claim 11, wherein forming the barrier layer comprises:

annealing the interconnect features in an inert environment to form the barrier layer, the barrier layer comprising a metal oxide.

14. The method of claim 11 wherein the steps of filling the via opening with a copper alloy and simultaneously depositing a blanket coating comprise:

physical vapor deposition of copper alloy material.

15. The method of claim 14 wherein the steps of filling the via opening with a copper alloy and simultaneously depositing a blanket coating further comprise:

electroplating deposition of copper alloy material.

16. The method of claim 11 wherein patterning the blanket coating of the copper alloy to form interconnect features comprises:

forming a tri-layer mask over the blanket coating;
forming a pattern in the tri-layer mask; and
transferring the pattern in the tri-layer mask into the blanket coating by anisotropically etching the blanket through the tri-layer mask.

17. A method of forming an integrated circuit interconnect structure comprising:

depositing a low k dielectric layer on a substrate;

photolithographically patterning the low k dielectric layer to form an opening in the low k dielectric layer;

lining the opening with a seed layer and electroplating a metal on the seed layer to fill the opening with a metal, wherein the metal extends above a top surface of the low k dielectric layer;

photolithographically patterning the metal to form interconnect features, the interconnect features include respective first portions within the opening in the low k dielectric layer and respective second portions extending above the low k dielectric layer;

forming an oxide barrier lining the interconnect features after patterning the metal, the oxide barrier disposed between a surface of the first portion and a surface of the opening in the low k dielectric layer; and depositing a dielectric material around the respective second portions of the interconnect features extending above the low k dielectric layer.

18. The method of claim 17 wherein the step of forming an oxide barrier lining the interconnect features includes an annealing step.

19. The method of claim 17 wherein the step of photolithographically patterning the low k dielectric layer comprises:

forming a hard mask over the low k dielectric layer;
forming a tri-layer mask over the hard mask;
forming an opening in the tri-layer mask;
forming an opening in the hard mask using the tri-layer mask as a pattern; and
isotropically etching the opening in the low k dielectric layer.

20. The method of claim 17 further comprising forming air gaps between adjacent interconnect features during the step of depositing a dielectric material.

* * * * *